(12) United States Patent
Paladugu et al.

(10) Patent No.: US 12,388,433 B2
(45) Date of Patent: Aug. 12, 2025

(54) HIGH VOLTAGE SWITCH

(71) Applicant: NXP USA, Inc., Austin, TX (US)

(72) Inventors: Ranga Seshu Paladugu, Milpitas, CA (US); Soon G Lim, San Jose, CA (US); Ronak Prakashchandra Trivedi, Cupertino, CA (US); Carmelo Morello, San Jose, CA (US)

(73) Assignee: NXP USA, Inc., Austin, TX (US)

( * ) Notice: Subject to any disclaimer, the term of this patent is extended or adjusted under 35 U.S.C. 154(b) by 97 days.

(21) Appl. No.: 18/485,149

(22) Filed: Oct. 11, 2023

(65) Prior Publication Data

US 2024/0178827 A1    May 30, 2024

(30) Foreign Application Priority Data

Nov. 30, 2022 (EP) .................................... 22210527

(51) Int. Cl.
  *H03K 17/0412* (2006.01)
  *H03K 17/10* (2006.01)
  *H03K 17/687* (2006.01)

(52) U.S. Cl.
  CPC ..... *H03K 17/04123* (2013.01); *H03K 17/102* (2013.01); *H03K 17/687* (2013.01)

(58) Field of Classification Search
  CPC ........... H03K 17/04123; H03K 17/102; H03K 17/687; H03K 2217/0018; H03K 2217/0054; H03K 17/081; H03K 17/6871; H03K 17/6872; H03K 17/08104; H03K 17/56; H03K 19/018592; H03K 19/0185; H03H 11/28
  See application file for complete search history.

(56) References Cited

U.S. PATENT DOCUMENTS 6,888,369 B1    5/2005 Wang et al.
6,888,370 B1    5/2005 Luo et al.
(Continued)

FOREIGN PATENT DOCUMENTS

CN    106464246 A    2/2017

OTHER PUBLICATIONS

Rakesh Panguloori, "Achieve Bidirectional Control and Protection Through Back-to-Back Connected eFuse Devices", TI Application Report, SLVA948—Dec. 2017.

*Primary Examiner* — Jung Kim

(57) ABSTRACT

The present disclosure relates to a high voltage bidirectional power switch circuit that includes a high voltage block coupled to a first terminal; and a resistance network including modules connected in parallel with each other between the high voltage block and a second terminal. Each module includes a precision resistor connected in series with a conduction channel of a resistance switching transistor; a first biasing resistor connected between a first conduction channel terminal and a control terminal of the resistance switching transistor; a second biasing resistor connected between a second conduction channel terminal and the control terminal; a body bias control circuit configured to control a bias of body diodes of the resistance switching transistor; a switchable sourcing current source; and a switchable sinking current source. Switches of the switchable sourcing current source and the switchable sinking current source receive switching signals to control the resistance switching transistor.

18 Claims, 6 Drawing Sheets

(56) References Cited

U.S. PATENT DOCUMENTS

| | | |
|---|---|---|
| 7,205,788 B1 | 4/2007 | Wang et al. |
| 9,530,495 B1 | 12/2016 | Dinh et al. |
| 2014/0149773 A1 | 5/2014 | Huang et al. |
| 2023/0163587 A1* | 5/2023 | Lu ........................ H03K 17/687 |
| | | 361/93.1 |

* cited by examiner

HIGH VOLTAGE SWITCH

CROSS-REFERENCE TO RELATED APPLICATIONS

This application claims priority under 35 U.S.C. § 119 to European patent application no. 22210527.2, filed Nov. 30, 2022, the contents of which are incorporated by reference herein.

FIELD

The present disclosure relates to a high voltage switch and, in particular, to a high voltage bidirectional power switch.

SUMMARY

According to a first aspect of the present disclosure there is provided a high-voltage, HV, bidirectional power switch, BPS, circuit comprising:
  a first terminal and a second terminal;
  a HV block coupled to the first terminal, wherein the HV block comprises two HV transistors arranged in series in a BPS configuration (which may be referred to as a BPS topology); and
  a resistance network comprising a plurality of switchable resistance modules connected in parallel with each other between the HV block and the second terminal, wherein each switchable resistance module comprises:
    a precision resistor connected (or coupled) in series with a conduction channel of a resistance switching transistor;
    a first biasing resistor connected between a first conduction channel terminal of the resistance switching transistor and a control terminal of the resistance switching transistor;
    a second biasing resistor connected between a second conduction channel terminal of the resistance switching transistor and the control terminal of the resistance switching transistor;
    a body bias control circuit configured to control a bias of body diodes of the resistance switching transistor;
    a switchable sourcing current source comprising a first current source and a first source switch connected in series between a positive voltage supply terminal and the control terminal of the resistance switching transistor; and
    a switchable sinking current source comprising a second current source and a second source switch connected in series between a negative voltage supply terminal and the control terminal of the resistance switching transistor,
    wherein the first source switch and the second source switch are configured to receive switching signals to selectively enable or disable the resistance switching transistor.

In one or more embodiments the switching signals comprise:
  if the HV BPS circuit is set to an ON state, complementary switching signals for:
    selectively enabling the first source switch and selectively disabling the second source switch; or
    selectively disabling the first source switch and selectively enabling the second source switch; or
  if the HV BPS circuit is set to an OFF state, disabling switching signals for disabling the first source switch and disabling the second source switch.

In one or more embodiments, for each switchable resistance module, the first biasing resistor and the second biasing resistor may comprise the same resistance value.

In one or more embodiments, for each switchable resistance module, a resistance value of the first biasing resistor and a resistance value of the second biasing resistor may both be greater than a resistance value of the precision resistor In one or more embodiments the body bias control circuit may comprise a body voltage selector circuit configured to:
  select a voltage from:
    a first voltage at the first conduction channel terminal; and
    a second voltage at the second conduction terminal; and
  connect the selected voltage to the body terminal of the LV transistor.

In one or more embodiments, the body voltage selector circuit may be configured to:
  select a highest voltage from the first voltage and the second voltage if the resistance switching transistor is a PMOS transistor; and
  select a lowest voltage from the first voltage and the second voltage if the resistance switching transistor is a NMOS transistor.

In one or more embodiments the two HV transistors may comprise a first HV transistor connected in series with a second HV transistor. An orientation of each of the first HV transistor and the second HV transistor may be arranged such that a body diode conduction path of the first HV transistor is in an opposite direction to a body diode conduction path of the second HV transistor.

In one or more embodiments, the HV BPS circuit may comprise a first sense resistor connected between the first terminal and the HV block.

In one or more embodiments the HV BPS circuit may comprise a second sense resistor connected between the second terminal and the LV resistance network.

In one or more embodiments the HV block may be configured to receive HV control signals for selectively enabling the two HV transistors for selectively enabling the HV BPS circuit.

In one or more embodiments the HV BPS circuit may comprise a switch control circuit. The switch control circuit may be configured to:
  receive a HV enable signal from a separate circuit, controller or software, the HV enable signal indicating whether the HV BPS circuit should be set to an ON state or an OFF state; and
  if the HV enable signal indicates the ON state:
    output HV control signals for selectively enabling the two HV transistors; and
    output the switching signals as complementary switching signals to the first source switch and the second source switch of each switchable resistance module; or
  if the HV enable signal indicates the OFF state
  output HV control signals for selectively disabling the two HV transistors; and
  output the switching signals as disabling signals to disable both the first source switch and the second source switch of each switchable resistance module.

In one or more embodiments the switch control circuit may be configured to:
receive the HV enable signal indicating that the HV BPS circuit should be set to an ON state;
output the complementary switching signals to each switchable resistance module at a first time; and
output the HV control signals to enable the two HV transistors at a second time, wherein the second time is delayed with respect to the first time.

In one or more embodiments the switch control circuit may be configured to:
receive the HV enable signal indicating that the HV BPS circuit should be set to an OFF state;
output the HV control signals to disable the two HV transistors at a third time; and
output the disabling switching signals to each switchable resistance module at a fourth time, wherein the fourth time is delayed with respect to the third time.

In one or more embodiments the switch control circuit may be configured to:
receive a required resistance signal from a separate circuit, controller or software, the required resistance signal indicating a required resistance value of the resistance network; and
provide the complementary switching signals to the first source switch and the second source switch of each switchable resistance module based on a required resistance value of the required resistance signal in the HV BPS ON state.

In one or more embodiments the resistance switching transistor of each switchable resistance module may be a low voltage, LV, resistance switching transistor.

According to a second aspect of the present disclosure, there may be provided an integrated circuit comprising any of the HV BPS circuits disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The FIGURES and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

Figure 1:
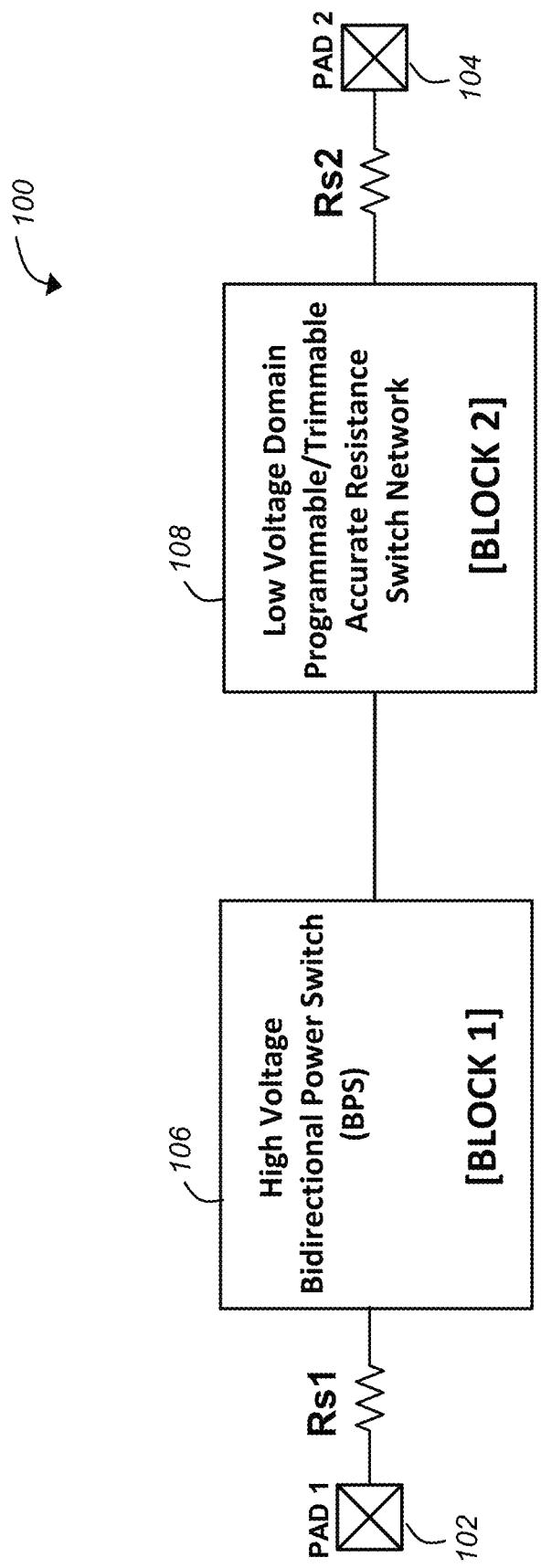
FIG. 1 illustrates a schematic overview of a HV BPS circuit comprising programmable resistance according to an embodiment of the present disclosure.

Some applications require a Pad/Pin with an accurate programmable/trimmable resistance with a turn ON/OFF capability in the high current and high voltage (HV) domain. The turn ON/OFF capability may enable the Pin to be configured as a voltage input/output or a current input using software. When the Pin is configured as a HV input or output, the switch in the block connecting to the Pin turns OFF providing a high impedance input/output. When the Pin is configured as current input, the switch turns ON and the block serves as an accurate programmable/trimmable termination resistance, for example as part of a receiver system, or can be used to sense the input current signal in the system.

Some applications also require the resulting resistor and switch combination to have bidirectional power switch (BPS) functionalities like bidirectional current flow (i.e positive and negative polarity current) in the ON state, bidirectional voltage blocking in the OFF state and low switch ON resistance. Bidirectional voltage blocking means any polarity voltage applied to input/output terminals should not turn ON the switch or have current conduction between the input and output terminals. The resistor and switch combination may also have to support high voltages, for example up to +/−36V (with the IC powered ON or OFF or with the switch turned ON or OFF), high transient currents for example up to +/−100 mA.

In addition, the accurate termination resistance programming/trimming capability necessitates the use of many switches in different switchable resistance modules to selectively switch different resistances in and out of the circuit. The ON resistances of all the switches in the programmable resistor block also have to be very small (compared to actual precision resistors in series) to reduce the block's overall effective resistance non-linearity with respect to input current magnitude and to reduce the overall resistance variation with respect to process and/or temperature.

To fulfil the above requirements, high voltage (HV) bidirectional power switches (BPS) typically employ large area HV devices/switches. In addition, the use of many HV device switches with low ON resistance and high current capabilities for resistance programming/trimming capability, requires huge device sizes which increases the overall block area significantly, making it infeasible to integrate the block on chip. Also, improper placement of lower area low voltage (LV) device switches in the block will result in device breakdowns under high voltage/current conditions.

The HV BPS of the present disclosure may address the above requirements without requiring many large area HV switches in the switchable resistance modules.

As disclosed herein, the term high voltage in relation to an electrical component means an electrical component capable of tolerating voltages or voltage differences in excess of a low voltage rating. The low voltage rating may correspond to a voltage range of +/−3V, +/−5V or other known conventional low voltage ranges, which may be application specific. A HV electrical component can tolerate voltages or voltage differences up to a high voltage rating such as +/−12 V, +/−24V, +/−36V, +/−48V or other known high voltage ranges which may be application specific. Here, the term tolerating refers to the electrical component operating at the specified voltages or voltage differences without incurring short term or long term damage.

As disclosed herein, the term low voltage in relation to an electrical component means an electrical component capable of only tolerating voltages or voltage differences within the low voltage rating. In other words, voltages in excess of the low voltage rating may cause damage to the low voltage electrical components.

FIG. 1 illustrates a schematic overview of a HV BPS circuit 100 comprising programmable resistance according to an embodiment of the present disclosure.

The HV BPS circuit 100 comprises a first terminal 102 (labelled as PAD1) and a second terminal 104 (labelled as PAD2). A HV block 106 is coupled in series with a low voltage domain resistance switch network 108 between the first terminal 102 and the second terminal 104. The low voltage domain resistance switch network is henceforth referred to as LV resistance network in the document. Optional first and second sense resistors Rs1, Rs2 are respectively connected between the first terminal 102 and the HV block 106 and between the second terminal 104 and the LV resistance network 108. The sense resistors Rs1, Rs2 can provide the function of current sensing for the HV BPS circuit 100 or can provide some additional offset resistance to the overall programmable resistance of the block. The input signal current going across the sense resistors Rs1, Rs2, generates a proportional voltage, which can be used to detect the current and limit the maximum current flowing through the circuit 100.

The HV block 106 operates in the HV domain and comprises two HV transistors arranged in series as in a conventional BPS topology. The two HV transistors may comprise: laterally-diffused metal-oxide semiconductor (LDMOS), drain extended MOS (DEMOS), double diffused MOS (DMOS) or any HV transistor type arranged in a known BPS configuration. To maintain low ON resistance the two HV transistor sizes are large. The gates of the two HV transistors are controlled to turn ON or OFF the transistor switches.

Figure 2:
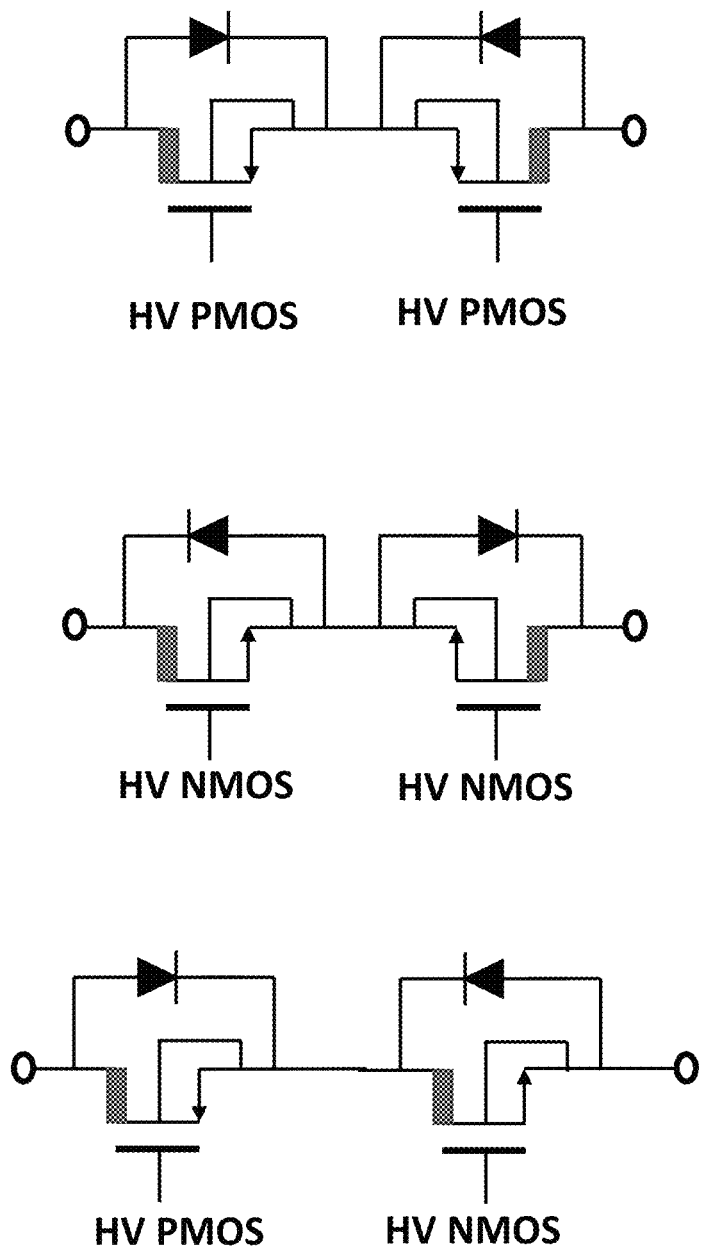
FIG. 2 illustrates example arrangements of two HV transistors in an HV block of an HV BPS circuit according to an embodiment of the present disclosure.

FIG. 2 illustrates example arrangements of the two HV transistors in the HV block 106. The two HV transistors comprise a first HV transistor and a second HV transistor. The example arrangements illustrate different PMOS/NMOS combinations, including two series connected PMOS transistors, two series connected NMOS transistors and a PMOS transistor connected in series with a NMOS transistor. In each arrangement, the orientation of each of the first HV transistor and the second HV transistor is arranged such that the body diode conduction path of the first HV transistor is in opposite direction to the body diode path of the second HV transistor.

As a result, the HV block 106 can provide BPS functionalities by supporting bidirectional current flow when the circuit 100 is in the ON condition and bidirectional voltage blocking when the circuit 100 is in the OFF condition. In the illustrated topologies, connecting the two transistors in series with opposing body diode paths overcomes the intrinsic body diode conduction of each HV transistor when certain voltages are applied to the circuit 100 in the OFF state. The second HV transistor provides the reverse biased blocking body diode in the path to cut off the current path in the OFF state.

The HV block 106 can also advantageously provide shielding of the LV resistance network 108 from high voltages in all conditions. The HV block 106 can protect the LV resistance network 108 from first terminal (PAD1) ESD requirements, stringent conditions on the first terminal 102 (PAD1) like the application of high voltages (e.g. up to +/−36V) beyond the HV power supply voltages of +/−24V, when the IC is powered OFF/ON or when the switch is turned OFF/ON etc.

Returning to FIG. 1, in some examples, the second terminal 104 may be connected to a reference voltage such as ground (0V) or any low voltages close to 0V, while the first terminal 102 may be used as bidirectional current input terminal. First terminal 102 may also be configured as HV voltage input/output using software. The supply voltage may comprise a positive supply voltage (e.g. 24V) or negative supply voltage (e.g. −24V). In the fault conditions, high voltages (e.g. up to +/−36V) beyond the HV power supply voltages (+/−24V) could be applied on the first terminal 102. Therefore, the voltages and currents across the first and second terminals 102, 104 may comprise different polarities. In any event, the polarity of the first terminal 102 with respect to the second terminal 104 may be either positive or negative.

In series with the HV block 106 is the LV resistance network 108 operating in the LV domain. The presence of the HV Block 106 at the front shielding the high voltages, helps in designing the LV resistance network 108 in the LV domain. As mentioned above, a key requirement of the HV BPS circuit 100 is to provide an accurate programmable/trimmable termination resistance. The LV resistance network 108 comprises numerous programmable/trimmable precision resistors each connected in series with a resistance switching LV transistor (which may also be referred to herein as a LV transistor, a LV device or a LV switch) to form a network like in a multiplexer (MUX) topology.

Figure 3A:
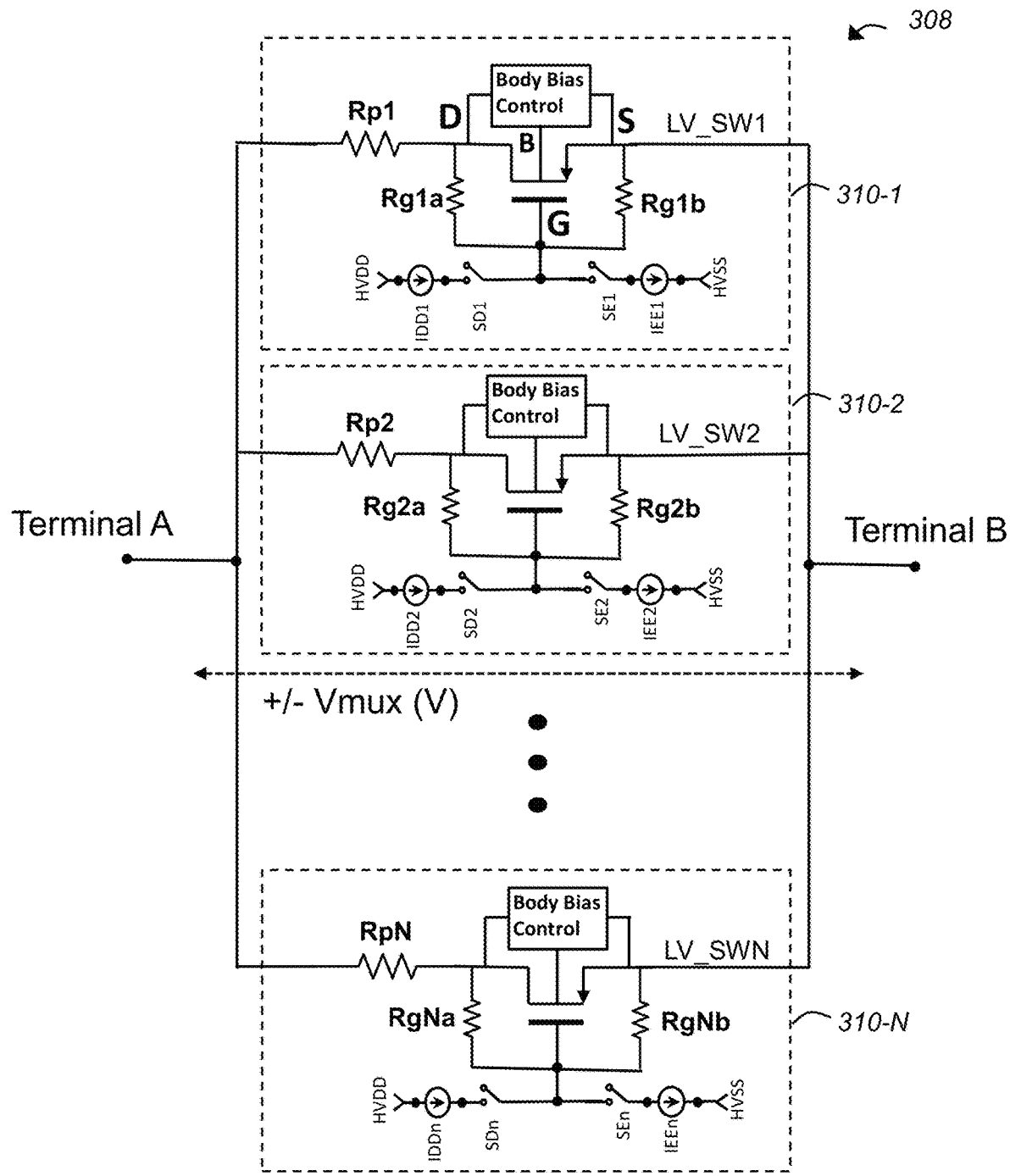
FIG. 3A illustrates a LV resistance network according to an embodiment of the present disclosure.
Figure 3B:
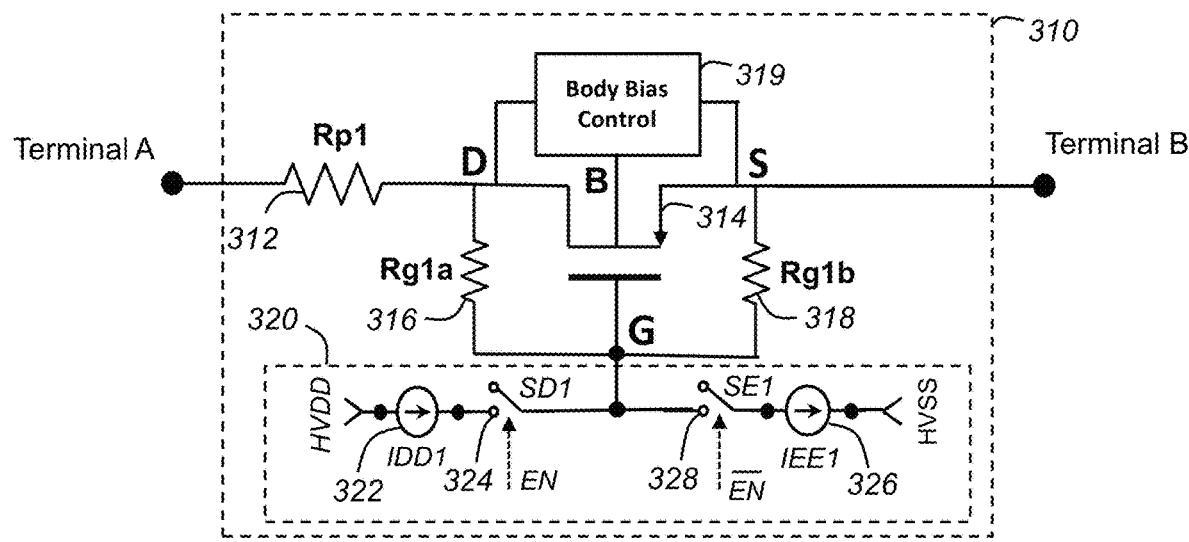
FIG. 3B illustrates a switchable resistance module of the LV resistance network of FIG. 3A.
Figure 3C:
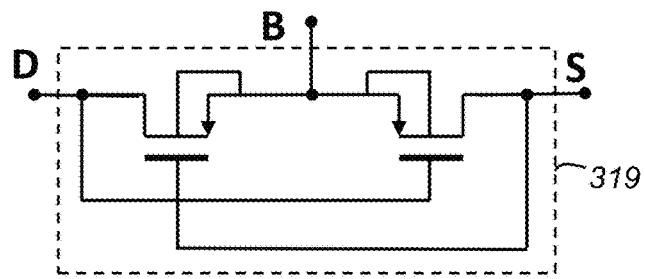
FIG. 3C illustrates a body bias control circuit of the switchable resistance module of FIG. 3B.

FIGS. 3A to 3C illustrate a LV resistance network 308 according to an embodiment of the present disclosure.

As illustrated in FIG. 3A, the LV resistance network 308 comprises a plurality of switchable resistance modules 310-1, 310-2, . . . 310-N (which may be referred to herein as switchable resistance modules 310). The switchable resistance modules 310 are connected in parallel to each other between a first resistance network terminal (Terminal A) for coupling to the HV block and a second resistance network terminal (Terminal B) for coupling to the second terminal of the HV BPS circuit. The parallel arrangement of the switchable resistance modules 310 forms a MUX topology. Different combinations of switchable resistance modules 310 may be selected/enabled depending on the programmable resistance value required (by an external system, e.g. an integrated circuit (IC) comprising the HV BPS circuit).

FIG. 3B illustrates an example switchable resistance module 310. Each switchable resistance module 310 of the LV resistance network 308 may be substantially the same, although values of a precision resistor 312 may vary in different switchable resistance modules 310. The aspect ratio (W/L) of the switching transistor 314 may also vary depending on the area requirements.

The switchable resistance module 310 comprises a precision resistor 312 (labelled as Rp1 in FIG. 3B and as Rp1, Rp2, . . . RpN for each of the plurality of switchable resistance modules in FIG. 3A), connected in series with a conduction channel of a resistance switching LV transistor 314 (labelled as LV_SW1, LV_SW2, LV_SWN for each of the plurality of switchable resistance modules in FIG. 3A). In this example, the resistance switching LV transistor 314 (which may simply be referred to as the LV transistor 314) is a MOSFET transistor (specifically a PMOS transistor) and the conduction channel comprises the channel between a first conduction channel terminal, D, and a second conduction channel terminal, S, of the LV transistor 314.

The switchable resistance module 310 also comprises a first biasing resistor 316 (labelled as Rg1a in FIG. 3B and as Rg1a, Rg2a, . . . RgNa for each of the plurality of switchable resistance modules in FIG. 3A), connected between the first conduction channel terminal, D, of the LV transistor 314 and a control terminal, G, of the LV transistor 314. The switchable resistance module 310 also comprises a second biasing resistor 318 (labelled as Rg1b in FIG. 3B and as Rg1b, Rg2b, . . . RgNb for each of the plurality of switchable resistance modules in FIG. 3A), connected between the second conduction channel terminal, S, of the LV transistor 314 and the control terminal, G, of the LV transistor 314. In this example, the first biasing resistor 316 has the same resistance as the second biasing resistor 318. In the illustrated example, the first conduction channel terminal is the drain terminal, D, of the LV transistor 314, the second conduction channel terminal is the source terminal, S, of the LV transistor 314 and the control terminal is the gate terminal, G, of the LV transistor 314. However, the orientation of the source terminal and drain terminal may change depending on the polarity of the voltage generated across the first and second resistance network terminals (Terminals A & B).

The switchable resistance module 310 further comprises a body bias control circuit 319 configured to control the bias of the body diodes of the LV transistor 314. For example, the body bias control circuit 319 may avoid a forward bias of the body diodes of the LV transistor 314. The body diode control circuit 319 may comprise a body voltage selector circuit comprising two PMOS transistors arranged to: (i) select a highest voltage of the two voltages at the first conduction channel terminal, D, and the second conduction terminal, S; and (ii) connect the selected highest voltage to the body terminal, B, of the LV transistor. The body bias control circuit 319 advantageously overcomes the intrinsic body diode conduction problem in the bidirectional switch OFF state. FIG. 3C illustrates an example body bias control circuit 319. It will be appreciated, that for examples employing NMOS LV transistors 314, the body bias control circuit 319 may comprise a body voltage selector circuit comprising two NMOS transistors arranged to: (i) select a lowest voltage of the two voltages at the first conduction channel terminal, D, and the second conduction terminal, S; and (ii) connect the selected lowest voltage to the body terminal, B, of the LV transistor.

The switchable resistance module 310 further comprises a gate control circuit 320. The gate control circuit 320 comprises a switchable sourcing current source comprising a first current source 322 (labelled as IDD1 in FIG. 3B and as IDD1, IDD2, . . . IDDN for each of the plurality of switchable resistance modules in FIG. 3A), connected in series with a first source switch 324 (labelled as SD1 in FIG. 3B and as SD1, SD2, . . . SDN for each of the plurality of switchable resistance modules in FIG. 3A) between a positive HV supply terminal HVDD and the control terminal, G, of the LV transistor 314. The gate control circuit 320 further comprises a switchable sinking current source comprising a second current source 326 (labelled as IEE1 in FIG. 3B and as IEE1, IEE2, . . . IEEN for each of the plurality of switchable resistance modules in FIG. 3A), connected in series with a second source switch 328 (labelled as SE1 in FIG. 3B and as SE1, SE2, . . . SEN for each of the plurality of switchable resistance modules in FIG. 3A) between a negative HV supply terminal HVSS and the control terminal, G, of the LV transistor 314. The first source switch 324 and the second source switch 328 are configured to receive switching signals, EN, $\overline{EN}$, to selectively enable or disable the switchable resistance module 310. As described below, the switching signals, EN, $\overline{EN}$, can switch ON or OFF the first source switch and the second source switch to control the resistance switching LV transistor 314 ON/OFF functionality.

The switching signals, EN, $\overline{EN}$, may comprise a first switching signal for controlling the first source switch 324 and a second switching signal for controlling the second source switch 328.

The switching signals, EN, $\overline{EN}$, may comprise complementary switching signals when the overall top level HV BPS circuit 100 is in an ON state. The complementary switching signals may comprise either: (i) the first switching signal configured for selectively enabling (or closing) the first source switch 324 and the second switching signal configured for selectively disabling (or opening) the second source switch 328; or (ii) the first switching signal configured for selectively disabling the first source switch 324 and the second switching signal configured for selectively enabling the second source switch 328. For example, to disable the LV transistor 314 and the switchable resistance module 310, the first source switch 324 is enabled in response to receiving an enable signal, EN; while the second source switch 328 is disabled in response to receiving the complementary enable signal, $\overline{EN}$. To enable the LV transistor 314 and the switchable resistance module 310, the first source switch 324 is disabled in response to receiving the complementary enable signal, $\overline{EN}$, while the second source switch 328 is enabled in response to receiving the enable signal, EN. It will be appreciated that if the LV transistor 314 is NMOS rather than PMOS, the signals would be the other way round (in other words the first source switch 324 is enabled and second source switch 328 is disabled to enable the LV transistor 314, and vice versa).

The switching signals, EN, $\overline{EN}$, may comprise disabling switching signals when the overall top level HV BPS circuit 100 is in an OFF state. The disabling switching signals may comprise the first switching signal and the second switching signal both configured for disabling the respective first and second source switches 324, 328 (both set to $\overline{EN}$).

Providing the gate control circuit 320 for controlling the gate terminal, G, of the LV transistor 314 advantageously enables the use of LV transistors in the switchable resistance modules 310 with BPS functionality.

As explained below, the topology of the LV transistor 314, biasing resistors 316, 318, body diode control circuit 319 and gate control circuit 320 in the switchable resistance module 310 can meet the requirements of HV BPS switch outlined above. Firstly, as detailed below, the disclosed topology can provide BPS functionality. In contrast, conventional circuit topology of CMOS transmission device switches does not have bidirectional voltage blocking capability when in the OFF state because of the intrinsic body diode present inside the PMOS/NMOS devices which will conduct for different voltage polarities in the OFF state.

Secondly, as also detailed below, the gate control circuit 320 and biasing resistors 316, 320 can provide the required dynamic variation of a gate voltage at the gate terminal, G, of the LV transistor 314. The gate terminal, G, voltage for the LV transistors 314 needs to vary dynamically as a function of the voltage at the drain and source terminals, D, S, which in turn depend on the polarity of the current flowing through the switchable resistance module 310 (i.e. the polarity of the current flowing between or voltage applied across the first and second resistance network terminals (Terminals A & B)). The arrangement of the gate control circuit 320 and biasing resistors also ensures correct biasing of the terminal voltages of the LV transistor 314 to ensure they do not exceed their safe operating area (SOA) maximum voltage rating across the varying voltage/current conditions and avoiding any associated device breakdown. The conventional use of fixed voltages (e.g. 0V to 5V) cannot be used to drive the gate terminal, G, to turn ON or turn OFF the LV switches 314 in a HV BPS circuit.

Operation of the switchable resistance module 310 will now be described. As noted above, the designation of the first and second conduction channel terminals as the drain terminal or source terminal is interchangeable depending on the direction/polarity of the current/voltage across the first and second resistance network terminals. For simplicity, we will follow the notation illustrated in FIGS. 3A and 3B with the first conduction channel terminal being the drain terminal, D, and the second conduction channel terminal being the source terminal, S.

When the first current source 322 is enabled (via the first source switch 324), a first current from the first current source 322 flows through the first and second biasing resistors 316, 318 to generate a gate-source-drain voltage, Vgsd1, and resultant gate voltage, Vg, on the gate terminal, G, dependent on a source voltage, Vs, at the source terminal, S, and a drain voltage, Vd, at the drain terminals, D. Similarly, when the second current source 326 is enabled (via the second source switch), a second current from the second current source 326 flows through the first and second biasing resistors 316, 318 to generate a gate-source-drain voltage, Vgsd2, and resultant gate voltage, Vg, on the gate terminal, G, dependent on the source and drain voltages, Vs, Vd.

The switchable sourcing current source comprising the first current source 322 and the first source switch 324 advantageously provides the first current to bias the gate voltage, Vg, at the gate terminal, G, equal to or higher than the Source/Drain terminal voltage to turn OFF the switch across varying voltage conditions as explained below.

To set the switchable resistance module 310 OFF (i.e turn OFF the LV transistor 314), the first source switch 324 is set ON and the second source switch 328 is set OFF (via the complementary switching signals EN, $\overline{EN}$). The first current from the first current source 322 flows through the first and second biasing resistors 316, 318 to generate a first gate-source-drain voltage, Vgsd1, across both the first and second biasing resistors (same resistance values). Therefore, in the OFF condition, the gate voltage, Vg, is dynamically biased at approximately the average value of the source voltage, Vs, and the drain voltage, Vd, added to the first gate-source-drain voltage, Vgsd1:

$$Vg \sim 0.5*(Vd+Vs)+Vgsd1 \quad Vg \sim 0.5*(Vd+Vs)+Vgsd1 \quad (1)$$

The combination of the first switchable sourcing current source and the first and second biasing resistors 316, 318 advantageously biases the gate voltage, Vg, equal to or higher than the source or drain voltage, Vs, Vd, to turn OFF the switch for either polarity across the source and drain terminals, thereby providing the bidirectional voltage blocking functionality.

To set the switchable resistance module 310 ON (i.e turn ON the LV transistor 314), the first source switch 324 is set OFF and the second source switch 328 is set ON (via the complementary switching signals EN, $\overline{EN}$). The second current from the second current source 326 flows through the first and second biasing resistors 316, 318 to generate a second gate-source-drain voltage, Vgsd2, across both the first and second biasing resistors (same resistance values). Therefore, in the ON condition, the gate voltage, Vg, is dynamically biased at approximately the average value of the source voltage, Vs, and the drain voltage, Vd, minus the second gate-source-drain voltage, Vgsd2:

$$Vg \sim 0.5*(Vd+Vs)-Vgsd2 \quad Vg \sim 0.5*(Vd+Vs)-Vgsd2 \quad (2)$$

When the overall HV BPS circuit is in the ON state and conducting current, a current flows through the LV resistance network 308 between the first and second resistance network terminals (Terminals A & B). Depending on the polarity and magnitude of the input signal currents, a voltage+/−Vmux is generated across the first and second resistance network terminals. The disclosed topology of the LV resistance network 308 and the plurality of switchable resistance modules 310 enable the use of the full voltage range of the maximum voltage rating of the LV transistors 314. For example, if the maximum breakdown voltage rating of the LV transistors is 5V (i.e SOA Max Vds=Vgs=Vgd=5V), then the LV resistance network 308 can advantageously tolerate a max voltage of +/−Vmux=+5V to −5V range without any device breakdown issues. This is because the gate voltage, Vg, scales with both the source voltage, Vs, and the drain voltage, Vd.

For a switchable resistance module in the OFF state (with the overall HV BPS circuit in the ON state), the gate voltage is dynamically biased approximately at (0.5*(Vd+Vs)+Vgsd1) (equation 1). As an illustrative example, the source voltage, Vs, equal to the voltage at the second resistance network terminal, may be zero Volts (Vs=Terminal B=0V), and the drain voltage, Vd, equal to the voltage at the first resistance network terminal, may be equal to the mux voltage, Vmux (Vd=Terminal A=Vmux). For a mux voltage, Vmux=+5V, the gate voltage, Vg, of the LV transistor 314 has to be close to +5V to turn off the PMOS LV transistor 314.

The presence of the first switchable current source 322 supports operation of the switchable resistance module 310 in its OFF state. In the absence of the first switchable current source, the first gate-source-drain voltage, Vgsd1, would be 0V and the gate voltage, Vg, would be +2.5V according to equation 1 (Vd=+5V, Vs=0V). As a result, the PMOS LV transistor 314 would never turn OFF, breaking the entire circuit. Inspection of equation 1, reveals that the first current source 322 and the resistance of the first and second biasing resistors 316, 318 should be selected to provide a first gate-source-drain voltage, Vgsd1, of +2.5V. As a result, the gate voltage, Vg, will be +5V, turning OFF the switch and satisfying the bidirectional voltage blocking functionality. For the opposite polarity input currents, with mux voltage, Vmux, equal to −5V, such that the drain voltage, Vd, is −5V and the source voltage, Vs, remains at 0V. The resulting gate voltage, Vg, will be 0V which will turn OFF the PMOS LV transistor 314. In this way, the switchable resistance module 310 remains in the OFF state regardless of the polarity of Vmux. More generally, if maximum input current range is needed, the magnitudes of first current source 322 and the resistance of the first and second biasing resistors 316, 318 should be selected to provide a positive first gate-source-drain voltage, Vgsd1, with a magnitude approximately equal to half of a maximum voltage rating of LV resistance network 308, which may be defined by the maximum voltage rating of the LV transistors 314. The example calculation illustrates that the disclosed LV transistor circuit topology avoids the generation of gate to source or gate to drain voltages, Vgs, Vgd, that exceed the breakdown voltage for the full mux voltage range of +/−Vmux=+5V to −5V range and the LV resistance network 308 can make use of the maximum SOA possible voltage range. This is because the gate voltage, Vg, scales with the drain voltage, Vd=Vmux. This maximum voltage range allows the maximum possible input signal current range flowing through the overall LV resistance network 308.

As mentioned above, the combination of the first switchable sourcing current source and the first and second biasing resistors 316, 318 advantageously biases the gate voltage, Vg, equal to or higher than the source or drain voltage, Vs, Vd to maintain the PMOS LV transistor in the OFF state, regardless of the polarity of the mux voltage, Vmux. If we consider a similar circuit with the first switchable sourcing current but without the first biasing resistor 316, we can further understand the advantages of the topology of FIGS. 3A and 3B. Without the first biasing resistor 316, the gate voltage, Vg, will be equal to a sum of the source voltage, Vs, and a third gate source voltage, Vgs3 (Vg=Vs+Vgs3) during the OFF state of the LV transistor. For the same source and drain voltages as above (Vs=0V, Vd=Vmux=+/−5V), if the second biasing resistor 318 and the first source current 322 are selected such that the third gate-source voltage, Vgs3, is 2.5V, then the gate voltage, Vg, is fixed at 2.5V independently of the drain voltage, Vd. Therefore, the mux voltage, Vmux, cannot exceed 2.5V+Vth (Vth is the threshold voltage of the PMOS LV transistor) because the LV transistor 314 will start conducting. Furthermore, in the opposite polarity, the mux voltage cannot be less than −2.5V because the gate to drain voltage, Vgd, would then exceed 5V and cause breakdown issues. Therefore, the maximum mux voltage range for a switchable resistance module without the first biasing resistor 316 is approximately only+/−2.5V, which is half of the range of the switchable resistance modules 310 of FIGS. 3A and 3B. In other words, the disclosed switchable resistance modules 310 provide twice the voltage and input signal current range as a similar circuit without the first biasing resistor 316.

Turning now to the switchable resistance module 310 in the ON state (with the overall HV BPS circuit in the ON state), the gate voltage, Vg, is dynamically biased approximately at (0.5*(Vd+Vs)−Vgsd2) (equation 2). The Gate to Source voltage, Vgs, of the LV switching transistor 314 is symmetric (though not constant) and an even function for both polarities/directions of current as the gate voltage, Vg, is symmetrically dependent on both the drain voltage, Vd, and the source voltage, Vs. This advantageously creates a lower non-linearity in the switch ON resistance with respect to bidirectional current flow.

With the switchable resistance module 310 in the switch ON state, LV switching transistor 314 can utilize higher gate to source voltage, $V_{GS}$, in both current directions without any issues of device breakdown. Higher gate to source voltage helps to reduce the switch ON resistance and provide higher current conduction capability.

Although the switchable resistance modules 310 have been described having PMOS LV transistors 314, it will be appreciated that in some examples, the LV transistors 314 may be NMOS LV transistors 314. In such examples, to set the NMOS LV transistor 314 and the switchable resistance module 310 to the ON state, the switchable sourcing current source comprising the first current source 322 would be enabled with the switchable sinking current source comprising the second current source 326 disabled. Similarly, to set the NMOS LV transistor 314 and the switchable resistance module 310 to the OFF state, the switchable sourcing current source comprising the first current source 322 would be disabled with the switchable sinking current source comprising the second current source 326 enabled.

It will be appreciated that the implementation of the switchable current sources may be implemented in a number of ways. For example, the first current source 322 may be implemented by a PMOS transistor device or a cascode PMOS devices current source circuit. The second current source 326 may be implemented by a NMOS transistor device or a cascode NMOS devices current source circuit. In some examples, the first and second source switches 324, 328 (SD1 . . . n, SE1 . . . n) may be integrated inside the corresponding first or second current sources 322, 326. In other examples, the first and second source switches 324, 328 may be implemented as separate NMOS and/or PMOS transistor device switches (pass transistor topology).

In some examples, the resistance of the first and second biasing resistors 316, 318 may be greater than the resistance of the precision resistors 312. In some examples, the resistance of the first and second biasing resistors 316, 318 may be greater than the resistance of the precision resistors 312 by at least one order of magnitude. The first and second biasing resistors 316, 318 provide a leakage current path and a high resistance path when the corresponding LV transistor 314 is turned OFF. Therefore, even when the LV transistor 314 and corresponding switchable resistance module 310 is turned OFF, the high resistance value first and second gate biasing resistors 316, 318 are in series with the smaller precision resistor 312 creating a small resistance error in the overall LV resistance network 308. The first and second biasing resistors 316, 318 may be sized depending on the system error tolerance requirement. Providing high resistance values for the first and second biasing resistors 316, 318 can also advantageously reduce the magnitude of the first and second currents from the respective first and second current sources. The first and second currents can flow into the first and second resistance network terminals (Terminals A & B) creating a small error in the overall system (HV BPS circuit), therefore reducing the magnitude of the currents reduces the error.

The structure of the switchable resistance module 310 may be repeated for each parallel path in the LV resistance network 308 (FIG. 3A). Enabling different combinations of switchable resistance modules 310 while disabling others can provide a desired programmable resistance value. In some examples, at least one switchable resistance module 310 is enabled/turned ON, if the overall HV BPS circuit is ON. Alternatively, or in addition, the resistance network may further comprise a non-switchable resistance branch connected between the first and second resistance network terminals (Terminals A & B) that only comprises a precision resistor without a series LV transistor. Providing a low impedance path between the first and second resistance network terminals (Terminals A & B) of the Resistor network MUX (FIGS. 3A & 3B) advantageously avoids a high impedance condition across the LV resistor network 308 and LV transistors 314 and the associated voltage overstress and/or device breakdown issues for high input currents, when the HV BPS circuit is ON. In addition, because of this, first or second currents injected from the respective first and second current sources 322, 326 in each switchable resistance module 310 will divide almost equally between the first and second biasing resistors 316, 318 to create the necessary gate to source voltage (Vgs) for the LV transistor 314.

Figure 4:
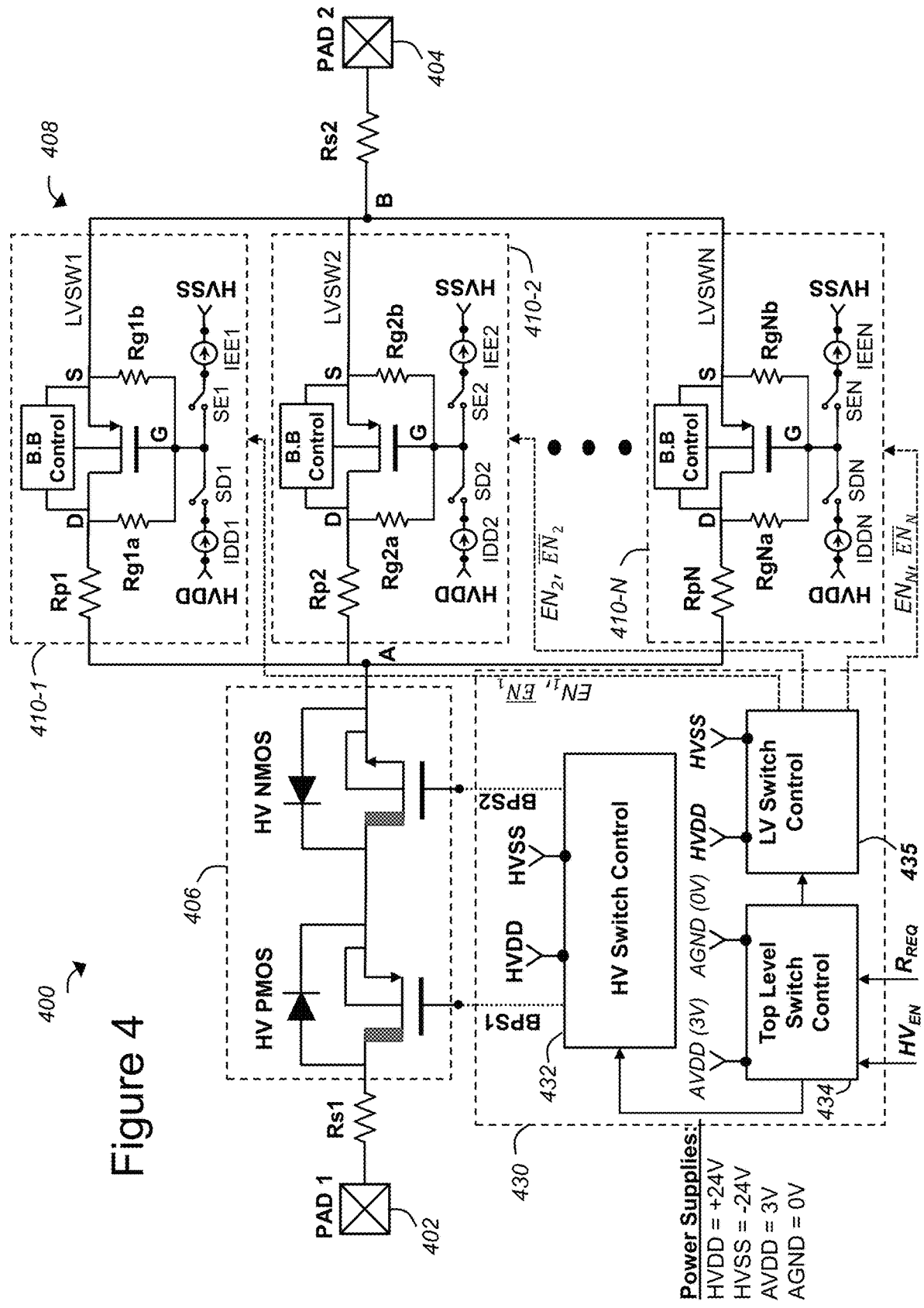
FIG. 4 illustrates a detailed HV BPS circuit according to an embodiment of the present disclosure.

FIG. 4 illustrates a detailed HV BPS circuit 400 according to an embodiment of the present disclosure. Features of FIG. 4 also present in the earlier FIGURES have been given corresponding numbers in the 400 series and will not necessarily be described again here.

The HV BPS circuit 400 includes the HV block 406 including one of the two HV transistor combinations of FIG. 2. The HV BPS circuit also includes the LV resistance network 408 of FIGS. 3A to 3C. The HV block 406 is coupled to the first terminal 402 and the first resistance network terminal, A, of the LV resistance network 408. The second resistance network terminal, B, is coupled to the second terminal 404.

Also illustrated in this example is a switch control circuit 430. Some or all of the functionality of the switch control circuit 430 described below may form part of the HV BPS circuit 400 or may be provided by an external circuit, controller or software (e.g. part of an IC comprising the HV BPS circuit 400). The switch control circuit 430 comprises a HV switch control circuit 432, a top level switch control circuit 434 and a LV switch control circuit 435.

In this example, the top level switch control circuit 434 is coupled to a LV supply terminal, AVDD, of 3V and a LV reference terminal, AGND, of 0V. The LV switch control circuit 435 provides the switching signals $\{EN_1, \overline{EN_1}\}$, $\{EN_2, \overline{EN_2}\}, \ldots \{EN_N, \overline{EN_N}\}$, to the first and second source switches of each switchable resistance module 410-1, 410-2, ... 410-N. The top level switch control circuit 434 can operate in the LV domain and provide all switching logic for the circuit 400 as well as reference and control currents. The top level switch control circuit 434 may receive a required resistance, $R_{req}$, from a separate circuit, controller or software (not shown) and control the LV switch control circuit 435 to provide the switching signals for enabling/disabling each switchable resistance module 410-1, 410-2, ... 410-N accordingly. The top level switch control circuit 434 may also receive a HV BPS enable signal, $HV_{EN}$, from the separate circuit, controller or software defining whether the HV BPS circuit is in an ON or OFF state. In response to the HV BPS enable signal, $HV_{EN}$, the top level switch control circuit 434 may output control signalling to the HV switch control circuit 432 for setting the HV block 406 ON or OFF accordingly. In response to the HV BPS enable signal the top level switch control circuit 434 may output control signalling to the LV switch control circuit 435 for providing the switching signals to the LV resistance network 408, as described below.

The HV switch control circuit 432 is connected to/supplied by the positive HV supply terminal, HVDD, and the negative HV supply terminal, HVSS. The HV switch control circuit 432 may receive the control signalling from the top level switch control circuit 434 and output HV control signals, BPS1, BPS2, for controlling the two HV transistors of the HV block 406 to set the HV block 406 into the ON or OFF state.

The LV switch control circuit 435 is also connected to/supplied by the positive HV supply terminal, HVDD, and the negative HV supply terminal, HVSS. The LV switch control circuit 435 may receive control signalling from the top level switch control circuit 434 and output the switching signals ($EN_i$, $\overline{EN_i}$), for setting the first and second source switches of each switchable resistance module 410. The switching signals, ($EN_i$, $\overline{EN_i}$), may be HV signals and the first and second source switches may be HV switches.

Figure 5:
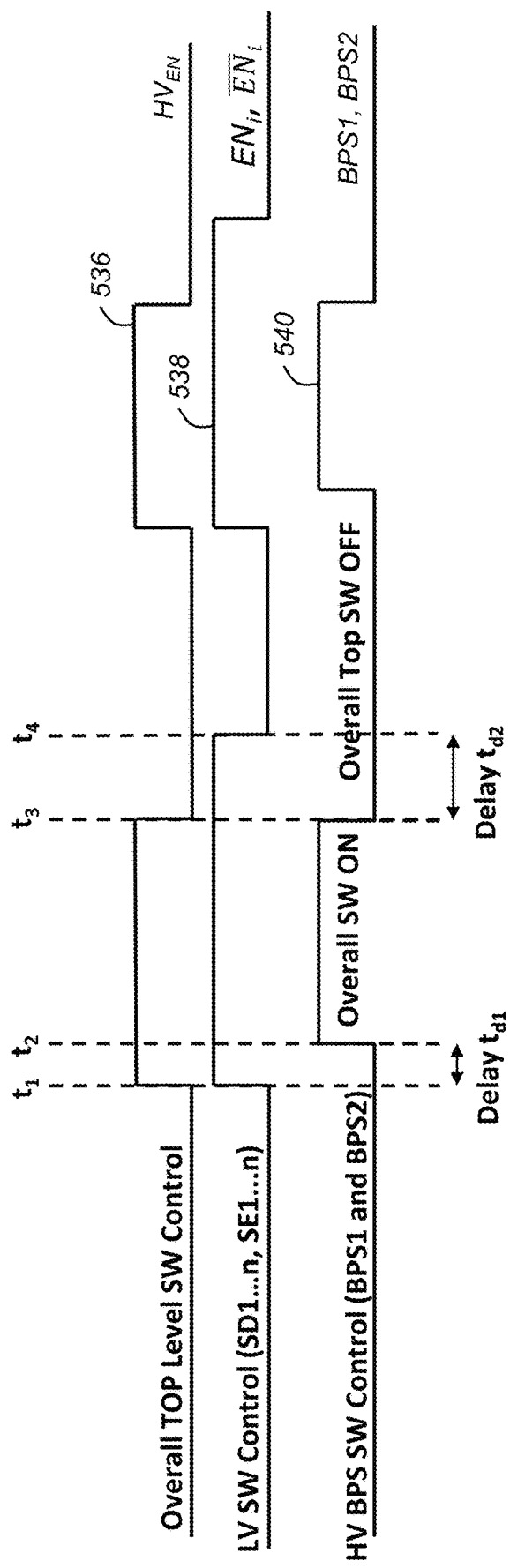
FIG. 5 illustrates a timing diagram for providing control signals for an HV BPS circuit according to an embodiment of the present disclosure.

FIG. 5 illustrates a timing diagram for the HV enable signal 536, $HV_{EN}$, the switching signals 538, ($EN_i$, $\overline{EN_i}$), provided to the first and second source switches of each switchable resistance module 410, and the HV control signals 540, BPS1, BPS2. Continuing reference will be made to FIG. 4.

The HV enable signal 536 indicates the demand of the external system/chip to have the HV BPS in the OFF state (current/voltage blocking) or ON state (current conducting with programmable resistance). A high value of the HV enable signal indicates that the HV BPS should be in the ON state while a low value indicates that the HV BPS should be in the OFF state.

The two HV BPS switches of the HV block 406 and the first and second source switches of each switchable resistance modules 410 will have finite turn ON and turn OFF times. It is important to avoid a condition in which the two HV BPS switches, HVPMOS, HVNMOS, are turned ON while the first and second source switches (of each switchable resistance module 410) are still turning ON or are still turned OFF. Such a condition would provide a high impedance across the LV resistance network 408 which may result in LV transistor device breakdown issues.

To avoid such a condition, the switch control circuit 430 may, in response to the HV enable signal 536 indicating that the HV BPS circuit 400 should be set ON, provide the switching signals 538 to selectively enable or disable the LV transistors of each switchable resistance network 410 at a first time, $t_1$, and provide the HV control signals 540 to enable the two HV transistors HVPMOS, HVNMOS, at a second time, $t_2$, wherein the second time, $t_2$, is delayed by a first delay time, $t_{d1}$, with respect to the first time, $t_1$.

To avoid a similar problem when the overall HV BPS circuit 400 is to be switched OFF, the switch control circuit 430 may, in response to the HV enable signal 536 indicating that the HV BPS circuit 400 should be set OFF, provide the HV control signals 540 to disable the two HV transistors HVPMOS, HVNMOS, at a third time, $t_3$, and provide disable signals 538 (or disabling signals) to turn OFF all first and second source switches of the switchable resistance network 410 at a fourth time, $t_4$, wherein the fourth time, $t_4$, is delayed by a second delay time, $t_{d2}$, with respect to the third time, $t_3$.

Providing the first delay time, td1, ensures that the selected LV transistors are completely turned ON (creating a low impedance path across the LV resistance network 408), before the HV switches HVPMOS, HVNMOS, are turned ON via the HV control signals 540. Only when all the programmed LV transistors and both the HV switches HVPMOS, HVNMOS are turned ON, the overall HV BPS circuit 400 is truly in the ON condition with the programmed resistance.

Similarly, providing the second delay time, td2, ensures that the selected LV transistors remain turned ON (creating a low impedance path across the LV resistance network 408), while the HV switches HVPMOS, HVNMOS, are turned OFF via the HV control signals 540, to avoid the LV transistors turning OFF first.

The disclosed HV BPS circuit advantageously combines a HV (BPS) block in series with LV, programmable accurate resistances and low-area LV device switches resulting in low circuit layout area, enabling the HV BPS circuit to be integrated on chip.

In the proposed LV device switch (transistor) topology, the gate terminal voltage is dynamically biased through two resistors coupled independently to both the source and drain terminals, with the gate voltage controlled by sourcing and sinking current sources through switches connected at the gate terminal. Different gate bias voltages are generated using this circuit configuration depending on the switch operating state. In other words, the gate voltage is not a set of fixed voltage values, but dynamically varying as a function of source/drain voltages and their terminal voltages are carefully controlled to avoid device breakdowns under high voltage/current conditions. Implementing this LV transistor topology as a part of the LV resistance MUX network, offers BPS functionality, low ON resistance, low area and high current range capability.

The disclosed HV BPS circuit may be used in integrated circuits connected to a Pad/Pin that can be configured as voltage input/output or current input using software. When the Pin is configured as high voltage input/output, the HV BPS circuit turns OFF. When the Pin is configured as current input, the HV BPS circuit turns ON and serves as accurate programmable/trimmable termination resistance or can be used to sense the input current signal in the system. In general, the disclosed HV BPS circuit can be used in high voltage and high current applications connecting to a Pad/Pin with software configurable high voltage input/output and current input functionality. As a current input the HV BPS circuit can be used in applications that need programmable/trimmable termination resistance for different communication protocols or for any current sensing applications in the high voltage domain.

The instructions and/or flowchart steps in the above FIGURES can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A high voltage (HV) bidirectional power switch (BPS) circuit comprising:
   a first terminal and a second terminal;
   a HV block coupled to the first terminal, wherein the HV block comprises two HV transistors arranged in series in a BPS configuration; and
   a resistance network comprising a plurality of switchable resistance modules connected in parallel with each other between the HV block and the second terminal, wherein each switchable resistance module comprises:
      a precision resistor connected in series with a conduction channel of a resistance switching transistor;
      a first biasing resistor connected between a first conduction channel terminal of the resistance switching transistor and a control terminal of the resistance switching transistor;
      a second biasing resistor connected between a second conduction channel terminal of the resistance switching transistor and the control terminal of the resistance switching transistor;
      a body bias control circuit configured to control the bias of body diodes of the resistance switching transistor;
      a switchable sourcing current source comprising a first current source and a first source switch connected in series between a positive voltage supply terminal and the control terminal of the resistance switching transistor; and
      a switchable sinking current source comprising a second current source and a second source switch connected in series between a negative voltage supply terminal and the control terminal of the resistance switching transistor,
      wherein the first source switch and the second source switch are configured to receive switching signals to selectively enable or disable the resistance switching transistor.

2. The HV BPS circuit of claim 1, wherein the switching signals comprise:
   if the HV BPS circuit is set to an ON state, complementary switching signals for:
      selectively enabling the first source switch and selectively disabling the second source switch; or
      selectively disabling the first source switch and selectively enabling the second source switch; or
   if the HV BPS circuit is set to an OFF state, disabling switching signals for disabling the first source switch and disabling the second source switch.

3. The HV BPS circuit of claim 1, wherein, for each switchable resistance module, a resistance value of the first biasing resistor and a resistance value of the second biasing resistor are both greater than a resistance value of the precision resistor.

4. The HV BPS circuit of claim 1, wherein the body bias control circuit comprises a body voltage selector circuit configured to:
select a voltage from:
a first voltage at the first conduction channel terminal; and
a second voltage at the second conduction terminal; and
connect the selected voltage to a body terminal of the resistance switching transistor.

5. The HV BPS circuit of claim 4, wherein the body voltage selector circuit is configured to select a highest voltage from the first voltage and the second voltage if the resistance switching transistor is a PMOS transistor.

6. The HV BPS circuit of claim 4, wherein the body voltage selector circuit is configured to select a lowest voltage from the first voltage and the second voltage if the resistance switching transistor is a NMOS transistor.

7. The HV BPS circuit of claim 1, wherein the two HV transistors comprise a first HV transistor connected in series with a second HV transistor, wherein an orientation of each of the first HV transistor and the second HV transistor is arranged such that a body diode conduction path of the first HV transistor is in opposite direction to a body diode conduction path of the second HV transistor.

8. The HV BPS circuit of claim 1, further comprising a first sense resistor connected between the first terminal and the HV block.

9. The HV BPS circuit of claim 1, further comprising a second sense resistor connected between the second terminal and the resistance network.

10. The HV BPS circuit of claim 1, wherein the HV block is configured to receive HV control signals for selectively enabling the two HV transistors for selectively enabling the HV BPS circuit.

11. The HV BPS circuit of claim 1, further comprising a switch control circuit, wherein the switch control circuit is configured to:
receive a HV enable signal from a separate circuit, controller, or software, the HV enable signal indicating whether the HV BPS circuit should be set to an ON state or an OFF state; and
if the HV enable signal indicates the ON state:
output HV control signals for selectively enabling the two HV transistors; and
output the switching signals as complementary switching signals to the first source switch and the second source switch of each switchable resistance module; or
if the HV enable signal indicates the OFF state:
output HV control signals for selectively disabling the two HV transistors; and
output the switching signals as disabling signals to disable both the first source switch and the second source switch of each switchable resistance module.

12. The HV BPS circuit of claim 11, wherein the switch control circuit is configured to:
receive the HV enable signal indicating that the HV BPS circuit should be set to an ON state;
output the complementary switching signals to each switchable resistance module at a first time; and
output the HV control signals to enable the two HV transistors at a second time, wherein the second time is delayed with respect to the first time.

13. The HV BPS circuit of claim 11, wherein the switch control circuit is configured to:
receive the HV enable signal indicating that the HV BPS circuit should be set to an OFF state;
output the HV control signals to disable the two HV transistors at a third time; and
output the disabling switching signals to each switchable resistance module at a fourth time, wherein the fourth time is delayed with respect to the third time.

14. The HV BPS circuit of claim 11, wherein the switch control circuit is configured to:
receive a required resistance signal from a separate circuit, controller or software, the required resistance signal indicating a required resistance value of the resistance network; and
provide the complementary switching signals to the first source switch and the second source switch of each switchable resistance module based on a required resistance value of the required resistance signal in the HV BPS ON state.

15. The HV BPS circuit of claim 1, wherein the resistance switching transistor of each switchable resistance module is a low voltage, LV, transistor.

16. The HV BPS circuit of claim 1, wherein:
the positive voltage supply terminal comprises a positive HV supply terminal; and
the negative voltage supply terminal comprises a negative HV supply terminal.

17. The HV BPS circuit of claim 1, wherein, for each switchable resistance module, the first biasing resistor and the second biasing resistor comprise the same resistance value.

18. An integrated circuit comprising the HV BPS circuit of claim 1.

* * * * *